US010451677B2

United States Patent
Tanaka

(10) Patent No.: US 10,451,677 B2
(45) Date of Patent: Oct. 22, 2019

(54) BATTERY STATE SENSING DEVICE AND MANUFACTURING METHOD THEREFOR

(71) Applicants: FURUKAWA ELECTRIC CO., LTD., Tokyo (JP); FURUKAWA AUTOMOTIVE SYSTEMS INC., Shiga (JP)

(72) Inventor: Kazuyuki Tanaka, Shiga (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 20 days.

(21) Appl. No.: 15/739,124

(22) PCT Filed: Jun. 28, 2016

(86) PCT No.: PCT/JP2016/003092
§ 371 (c)(1),
(2) Date: Dec. 21, 2017

(87) PCT Pub. No.: WO2017/002356
PCT Pub. Date: Jan. 5, 2017

(65) Prior Publication Data
US 2018/0180681 A1    Jun. 28, 2018

(30) Foreign Application Priority Data
Jul. 1, 2015  (JP) .................................. 2015-132334

(51) Int. Cl.
*G01R 31/364*  (2019.01)
*H01M 2/30*  (2006.01)
(Continued)

(52) U.S. Cl.
CPC ............ *G01R 31/364* (2019.01); *G01R 1/203* (2013.01); *H01M 2/30* (2013.01); *H01M 10/48* (2013.01)

(58) Field of Classification Search
CPC ....... G01R 31/364; G01R 1/203; H01M 2/30; H01M 10/48
(Continued)

(56) References Cited

U.S. PATENT DOCUMENTS 8,129,940 B2    3/2012  Abe
8,305,034 B2 *  11/2012 Rubio .................... G01R 1/203
                                                          320/105

(Continued)

FOREIGN PATENT DOCUMENTS

DE    102009007104    8/2010
JP    2009177903 A    8/2009
(Continued)

OTHER PUBLICATIONS

International Search Report for PCT Application No. PCT/JP2016/003092, dated Oct. 4, 2016, 4 pages.
(Continued)

*Primary Examiner* — Melissa J Koval
*Assistant Examiner* — Trung Nguyen
(74) *Attorney, Agent, or Firm* — Amin, Turocy & Watson, LLP

(57) ABSTRACT

A battery state detecting device (100) includes a shunt resistor (5), a post connection terminal (1), a harness connection terminal (2), a circuit board (6), and a connector (3). The post connection terminal (1) is electrically connected to a battery post (91) of a battery (90). The harness connection terminal (2) is electrically connected to a harness (80). The circuit board (6) detects current flowing in the shunt resistor (5). The connector (3) outputs a result of the detection made
(Continued)

by the circuit board (6). The post connection terminal (1) is arranged next to the circuit board (6) in a thickness direction of the circuit board (6). On one side of the circuit board (6) in the thickness direction thereof, at least part of a post connecting portion (11), which is a part of the post connection terminal (1) connected to the battery post (91), is arranged within a space between the harness connection terminal (2) and the connector (3).

6 Claims, 10 Drawing Sheets

(51) Int. Cl.
  *H01M 10/48* (2006.01)
  *G01R 1/20* (2006.01)
(58) Field of Classification Search
  USPC ........ 324/415, 437, 76.11, 126, 756.05, 538, 324/425–433, 200, 207.13, 233, 256, 324/500–530, 750.06
  See application file for complete search history.

(56) References Cited

U.S. PATENT DOCUMENTS

| | | |
|---|---|---|
| 8,932,086 B2 | 1/2015 | Thimon et al. |
| 2011/0050240 A1 | 3/2011 | Nentwig et al. |

FOREIGN PATENT DOCUMENTS

| | | |
|---|---|---|
| JP | 2009236641 A | 10/2009 |
| JP | 2012531722 A | 12/2012 |
| JP | 2015109236 A | 6/2015 |
| WO | 2008151181 A1 | 12/2008 |
| WO | 2014203492 A1 | 12/2014 |
| WO | 2015001781 A | 1/2015 |

OTHER PUBLICATIONS

European Search Report dated Dec. 13, 2018 for European Application No. 16817466.2, 4 pages.

\* cited by examiner

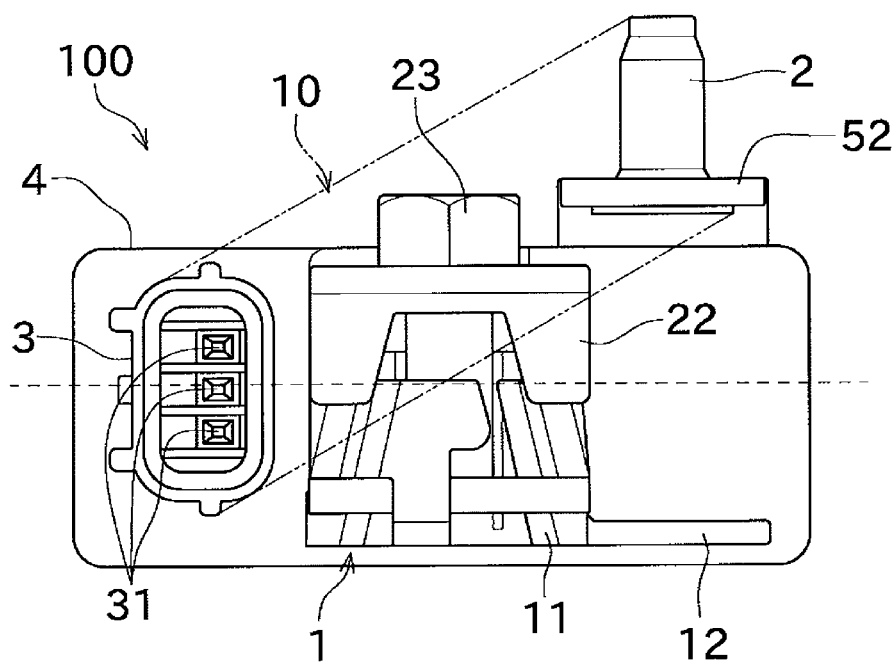
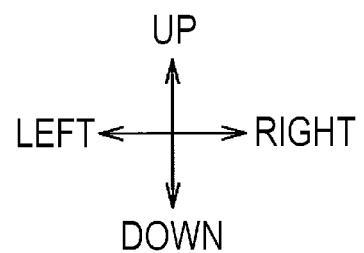
FIG. 5

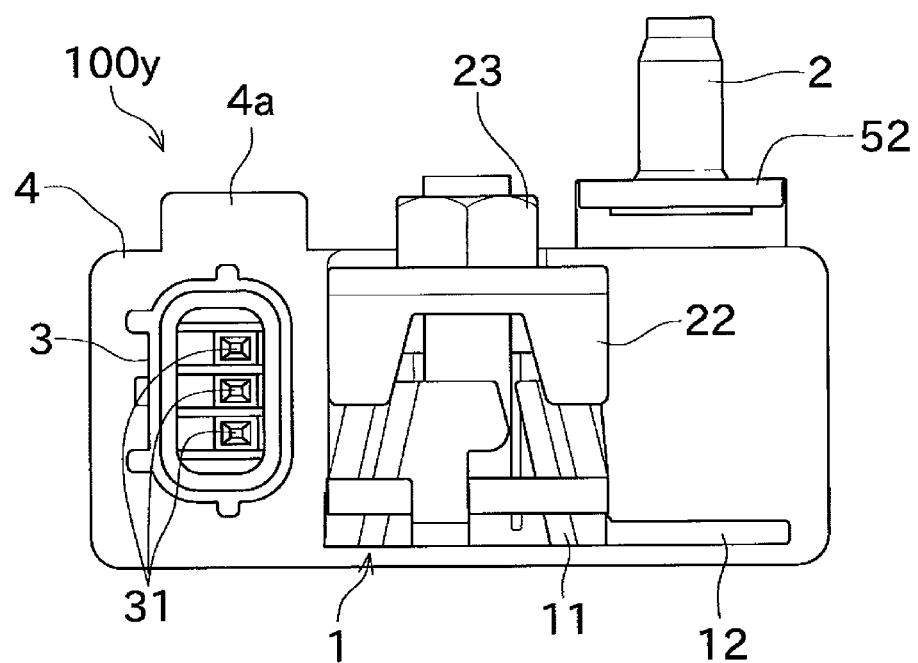
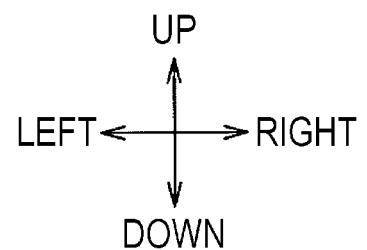
FIG. 8

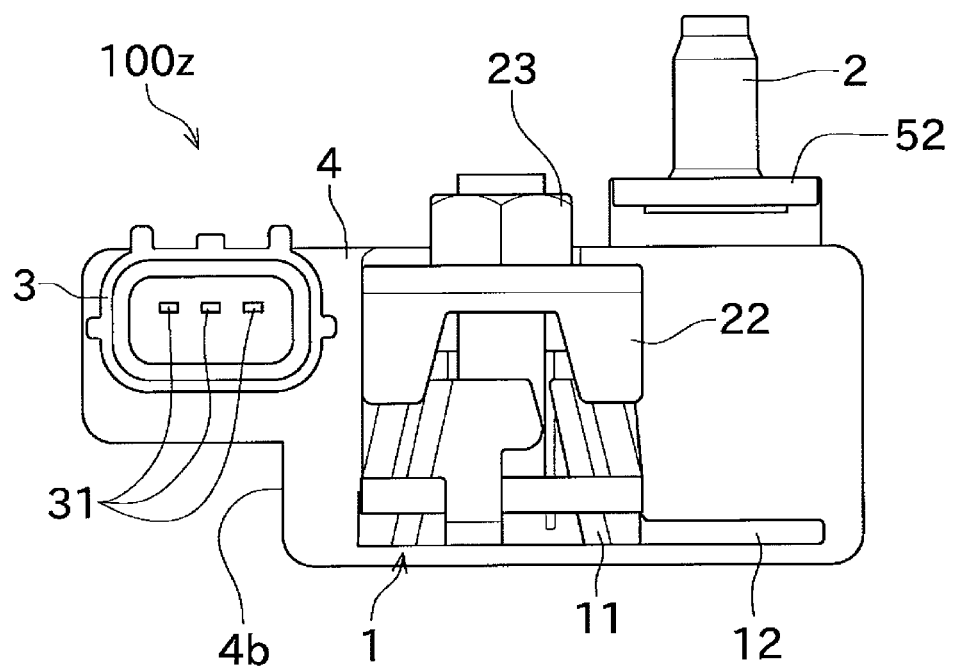
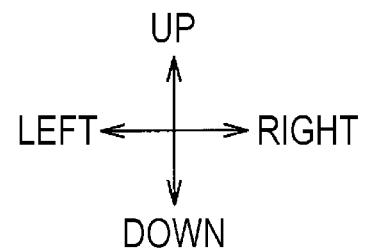
FIG. 9

BATTERY STATE SENSING DEVICE AND MANUFACTURING METHOD THEREFOR

RELATED APPLICATIONS

This patent application is a U.S. National Stage filing under 35 USC § 371 of international Patent Cooperation Treaty (PCT) Application No. PCT/JP2016/003092, filed Jun. 28, 2016, and entitled "BATTERY STATE SENSING DEVICE AND MANUFACTURING METHOD THEREFOR," which claims priority to Japanese Patent Application No. 2015-132334, filed Jul. 1, 2015, the disclosures of which applications are hereby incorporated by reference herein in their respective entireties.

TECHNICAL FIELD

The present disclosure relates primarily to a battery state detecting device that detects the state of a battery.

BACKGROUND ART

Battery state detecting devices that detect the state of a battery installed in a vehicle such as an automobile by detecting output current or the like from the battery have been known in the related art. Patent Document 1 discloses this type of battery state detecting device.

The battery state detecting device of Patent Document 1 includes a shunt resistor having a conductor that is at least partially flat, and a battery post terminal. The conductor of the shunt resistor and a shunt resistor connecting portion of the battery post terminal are connected by being welded together.

With this configuration, Patent Document 1 enables the connection part between the battery post terminal and the shunt resistor to be made compact in the thickness direction thereof, and thus a form factor of the battery state detecting device can be made smaller.

CITATION LIST

Patent Literature

Patent Document 1: WO 2015/001781A

SUMMARY OF INVENTION

Technical Problem

As illustrated in FIG. 10, according to the configuration of the above-described Patent Document 1, part of a shunt resistor 105 and a circuit board 106 are accommodated within a case 104. A harness connecting portion 102 is arranged at one side of the case 104 in a length direction thereof (in FIG. 10, the left-right direction), and is configured to protrude further to the one side in the length direction from the case 104. A connector 103 is arranged at the other side of the case 104 in the length direction thereof, and is configured to protrude further to the other side in the length direction from the case 104. The case 104 and the circuit board 106 are arranged on one side (in FIG. 10, a rear side) of a battery post terminal 101, such that a thickness direction of the case 104 and the circuit board 106 is parallel to an axial direction of a battery post (an axial direction of a battery post terminal 101), and a width direction of the case 104 and the circuit board 106 matches a direction in which the case 104 (the circuit board 106) and the battery post terminal 101 are arranged (in FIG. 10, a front-back direction). This increases the dimensions of the battery state detecting device in the left-right direction and front-back direction in FIG. 10, and it has therefore been difficult to achieve a smaller form factor.

Having been achieved in light of the foregoing circumstances, an object of the present disclosure is to provide a battery state detecting device that can reduce the dimensions of the device in various directions and reduce the form factor of the device as a whole.

Solution to Problem and Effects

The problem to be solved by the present disclosure is as described above. Means for solving this problem and effects thereof will be described next.

According to a first aspect of the present disclosure, a battery state detecting device having the following configuration is provided. The battery state detecting device connects a battery and a harness and detects a state of the battery. The battery state detecting device includes a shunt resistor, a first connection terminal, a second connection terminal, a circuit board, and a connector. The first connection terminal is electrically connected to a battery post of the battery. The second connection terminal is electrically connected to the harness. The circuit board detects current flowing in the shunt resistor. The connector outputs a result of the detection made by the circuit board. The first connection terminal is arranged next to the circuit board in a thickness direction of the circuit board. At least part of a post connecting portion, the post connecting portion being a part of the first connection terminal connected to the battery post, is arranged in a space between the second connection terminal and the connector on one side of the circuit board in the thickness direction of the circuit board.

In other words, in the related art, the circuit board has been provided such that the thickness direction thereof is parallel to the axial direction of the battery post, and the first connection terminal has been arranged on one side of the circuit board in a direction perpendicular to the thickness direction of the circuit board. Furthermore, in the related art, the second connection terminal has been arranged on one side of the circuit board and the connector has been arranged on the other side of the circuit board with respect to the direction perpendicular to the direction in which the circuit board and the first connection terminal are arranged (with the exception of the thickness direction of the circuit board). It has thus been difficult to achieve a smaller form factor with this configuration of the related art. With respect to this point, the battery state detecting device according to the aspects of the present disclosure has the above-described configuration. As such, a dimension of the battery state detecting device in the direction in which the circuit board and the first connection terminal are arranged can be reduced, and a dimension of the battery state detecting device in a direction perpendicular to the direction in which the circuit board and the first connection terminal are arranged (with the exception of the thickness direction of the circuit board) can be reduced as well. As a result, the space taken up by the battery state detecting device can be reduced in the aforementioned two directions, and a reduction in the form factor of the device can be achieved. Furthermore, when viewed in the axial direction of the battery post, the second connection terminal and the connector are arranged interposing the first connection terminal on each side of the first connection terminal, and thus even in a case where a force is for some reason imparted on wiring connected to these elements, that force can be prevented from concentrating on one part of the battery state detecting device. Accordingly, the position of the battery state detecting device does not shift easily, and the position where the battery state detecting device is attached can be maintained favorably.

Preferably, in the above-described battery state detecting device, the second connection terminal is arranged in a position shifted relative to the first connection terminal and the connector in an axial direction of the battery post.

Accordingly, a broad space can be secured in the periphery of the second connection terminal, and thus the degree of freedom with which wiring can be routed to the second connection terminal can be increased. Furthermore, the second connection terminal and the connector are arranged so as to be shifted with respect to the axial direction of the battery post, and thus even in the case where a force is for some reason imparted on wiring connected to these elements, that force can be distributed in the above-described axial direction without concentrating on one part of the battery state detecting device in the axial direction of the battery post. Accordingly, the position of the battery state detecting device does not shift easily, and the position where the battery state detecting device is attached can be maintained favorably.

Preferably, the above-described battery state detecting device has the following configuration. That is, the shunt resistor is formed in an elongated plate shape, and has a part in which a length direction of the shunt resistor is arranged parallel to an axial direction of the battery post. The shunt resistor includes a first conductor, a resistor, and a second conductor arranged in that order from one side in the axial direction of the battery post. The second connection terminal is provided on the second conductor.

Accordingly, the space for arranging the shunt resistor can be reduced, which in turn makes it possible to reduce the space taken up by the battery state detecting device. With the above-described simple configuration, it is easy to arrange the second connection terminal away from the first connection terminal and the connector in the axial direction of the battery post, and thus the degree of freedom with which wiring can be routed to the second connection terminal can be increased with ease.

Preferably, the above-described battery state detecting device has the following configuration. That is, the first connection terminal includes a linking portion, having a plate shape, that extends toward the circuit board. A fixing portion is formed in an end portion of the linking portion closer to the circuit board by bending the end portion. The shunt resistor is fixed to the fixing portion.

Accordingly, the shunt resistor is fixed to the fixing portion, which has a bent shape, and thus the degree of freedom of the orientation of the shunt resistor can be increased.

Preferably, the above-described battery state detecting device has the following configuration. That is, the fixing portion has a fixing surface facing toward the post connecting portion. The shunt resistor is formed in an elongated plate shape. An end surface on one side of the shunt resistor in a length direction of the shunt resistor is connected to the linking portion. A surface on one side of the shunt resistor in a thickness direction of the shunt resistor is connected to the fixing surface of the fixing portion.

Accordingly, the shunt resistor is fixed via two surfaces of the shunt resistor, which makes it possible to increase the mechanical strength of the fixed part with ease and favorably maintain the position of the shunt resistor.

Preferably, the above-described battery state detecting device has the following configuration. That is, the battery state detecting device further includes a casing that accommodates the circuit board. At least part of the shunt resistor is accommodated within the casing. A restricting portion that restricts a position where the shunt resistor is accommodated is formed in the casing.

Accordingly, the position of the shunt resistor can be favorably restricted, and thus the battery state detecting device can be assembled with ease.

Preferably, the above-described battery state detecting device has the following configuration. That is, the shunt resistor includes a protruding portion, the protruding portion formed in an elongated plate shape and protruding from one side of the casing in an axial direction of the battery post. The protruding portion includes an attachment portion formed by bending the protruding portion from a part close to the casing. The second connection terminal is provided on the attachment portion.

Accordingly, the mechanical strength of a base portion of the protruding portion can be increased. Additionally, the overall configuration of the battery state detecting device in the length direction of the shunt resistor can be made more compact.

According to a second aspect of the present disclosure, a manufacturing method such as that described below, for manufacturing the above-described battery state detecting device, is provided. That is, the method of manufacturing the battery state detecting device includes forming a casing and mold sealing. The forming the casing includes forming a casing that accommodates at least part of the shunt resistor through insertion molding such that the casing and the shunt resistor are integrated. The mold sealing includes sealing an internal space of the casing with a molding resin in a state where the circuit board is accommodated within the casing.

Accordingly, the casing can easily be formed so as to conform to the position, shape, and the like of the shunt resistor. Furthermore, the inner part of the casing is sealed with the molding resin so as to cover the entire circuit board, which makes it possible to prevent water, foreign objects, and the like from entering and favorably protect the circuit board.

BRIEF DESCRIPTION OF DRAWINGS

FIG. 5 is a front view of the battery state detecting device.

FIG. 8 is a front view of a battery state detecting device according to a second variation of the embodiment.

FIG. 9 is a front view of a battery state detecting device according to a third variation of the embodiment.

DESCRIPTION OF EMBODIMENT

Figure 1:
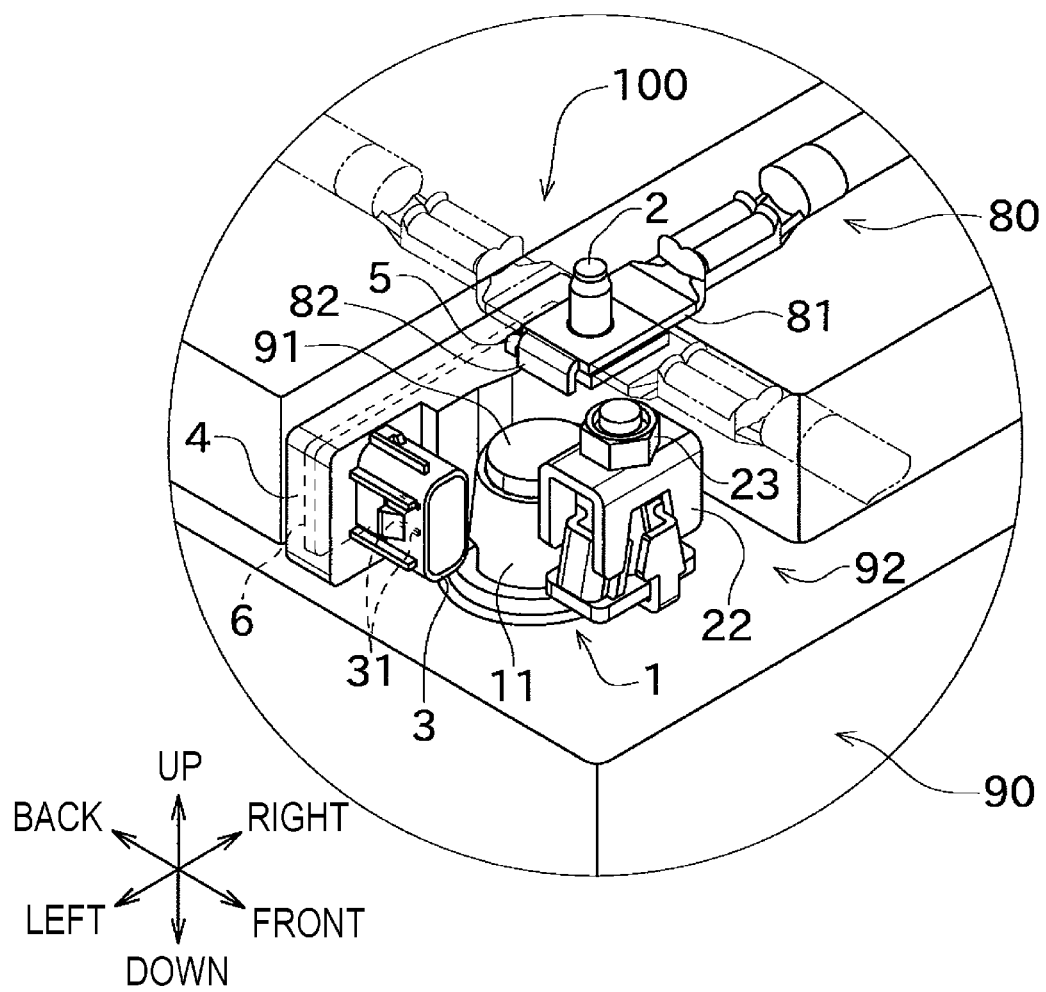
FIG. 1 is a perspective view illustrating a state in which a battery state detecting device according to one embodiment of the present disclosure is attached to a battery.
Figure 2:
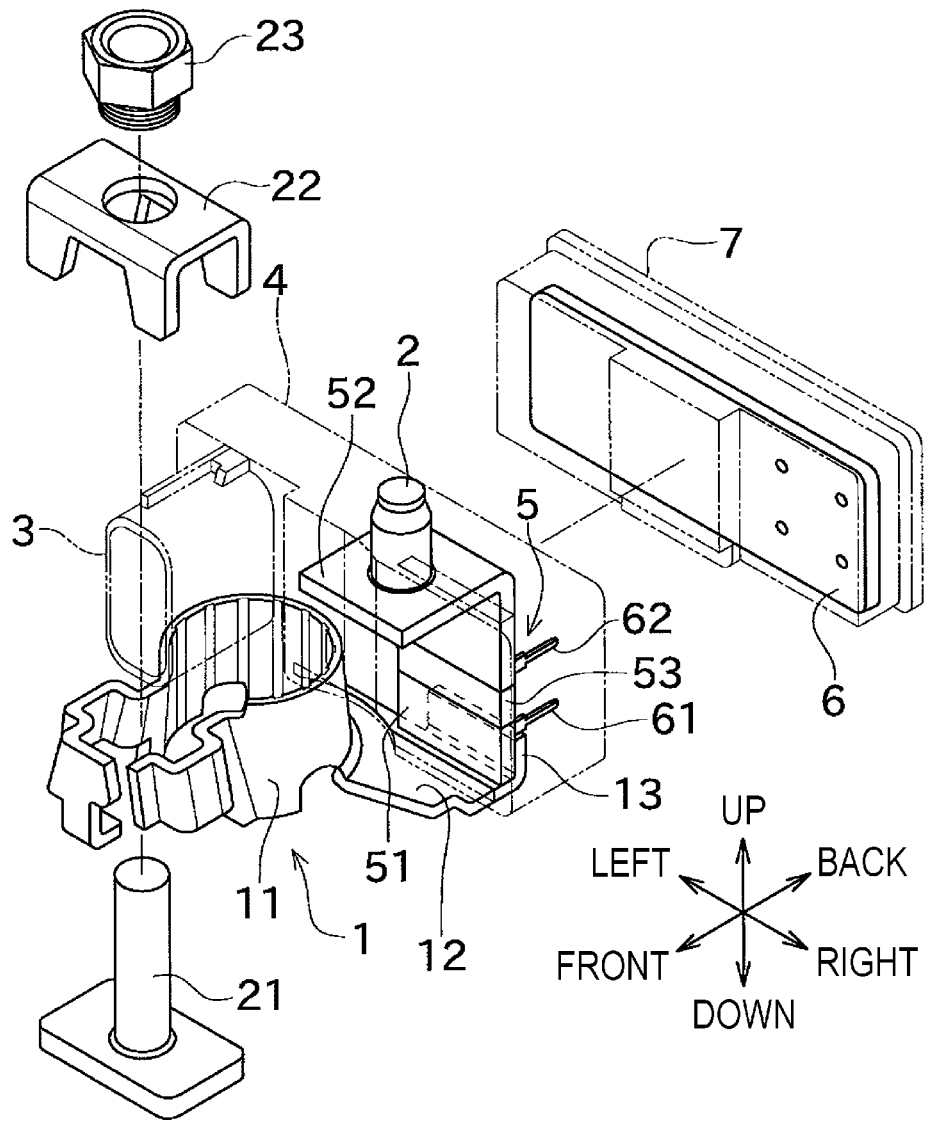
FIG. 2 is an exploded perspective view of the battery state detecting device.

Embodiments of the present disclosure will be described next with reference to the drawings. FIG. 1 is a perspective view illustrating a state in which a battery state detecting device 100 according to one embodiment of the present disclosure is attached to a battery post 91 of a battery 90. FIG. 2 is an exploded perspective view of the battery state detecting device 100. FIGS. 3A to 3F are schematic diagrams illustrating a process of manufacturing the battery state detecting device 100.

As illustrated in FIG. 1, the battery state detecting device 100 according to the present embodiment is attached to the battery post 91 of the battery 90, which is installed in an automobile or the like. The battery state detecting device 100 has a function for outputting, to an external device (not illustrated), a detection result pertaining to a battery state, such as a detected current. The external device to which the result is outputted may include an engine control unit (ECU) that controls the engine of the automobile.

In the present embodiment, the battery 90 is configured as a DIN-standard battery. A quadrangular depression 92 is formed in a corner of the upper surface of the battery 90, and the battery post 91 is arranged within this depression 92. At least a large part of the battery state detecting device 100 is accommodated within the depression 92.

As illustrated in FIGS. 1 and 2, the battery state detecting device 100 includes, as its primary elements, a post connection terminal (first connection terminal) 1 connected to the battery post 91, a harness connection terminal (second connection terminal) 2 connected to a harness 80, a connector 3, a casing 4, a shunt resistor 5, and a circuit board 6.

The post connection terminal 1 is formed by pressing, bending, or forging a metal plate. As illustrated in FIG. 2, a post connecting portion 11 that connects to the battery post 91 and a plate-shaped linking portion 12 extended from the post connecting portion 11 are formed in the post connection terminal 1.

The post connecting portion 11 is formed in a substantially cylindrical shape extending in the up-down direction, and is configured to be capable of gripping the battery post 91. Specifically, the post connection terminal 1 is electrically and mechanically connected to the battery post 91 by tightening a tightening bolt or the like in a state where the battery post 91 is inserted into the above-described cylindrical part.

The linking portion 12 is extended from a lower end of the outer peripheral surface of the post connecting portion 11, away from the post connecting portion 11, and is configured as a portion connected to the shunt resistor 5.

As illustrated in FIGS. 1 and 2, the harness connection terminal 2 is configured as an electrically-conductive bolt (e.g. a stud bolt). A terminal 81 is provided on an end portion of the harness 80, as illustrated in FIG. 1. A through-hole into which a bolt can be inserted is formed in what is substantially the center portion of the terminal 81. As illustrated in FIG. 1, the harness 80 is electrically and mechanically connected to the harness connection terminal 2 by inserting the harness connection terminal 2 into the terminal 81 of the harness 80 and then tightening a nut or the like (not illustrated).

The connector 3 is configured as an interface for outputting detection results from the battery state detecting device 100 to an ECU or the like. Output terminals 31 for connecting to the circuit board 6 are provided in an inner part of the connector 3.

The casing 4 is formed from a resin in an elongated substantially parallelepiped shape. The casing 4 is formed to be hollow, with a side thereof further from the post connecting portion 11 being open, and an accommodation space for accommodating the circuit board 6 and the like is formed in an inner part of the casing 4. The casing 4 is formed through insertion molding carried out while part of the shunt resistor 5 illustrated in FIG. 2 and part of the linking portion 12 of the post connection terminal 1 are each inserted into a molding die (described in detail later).

Figure 3:
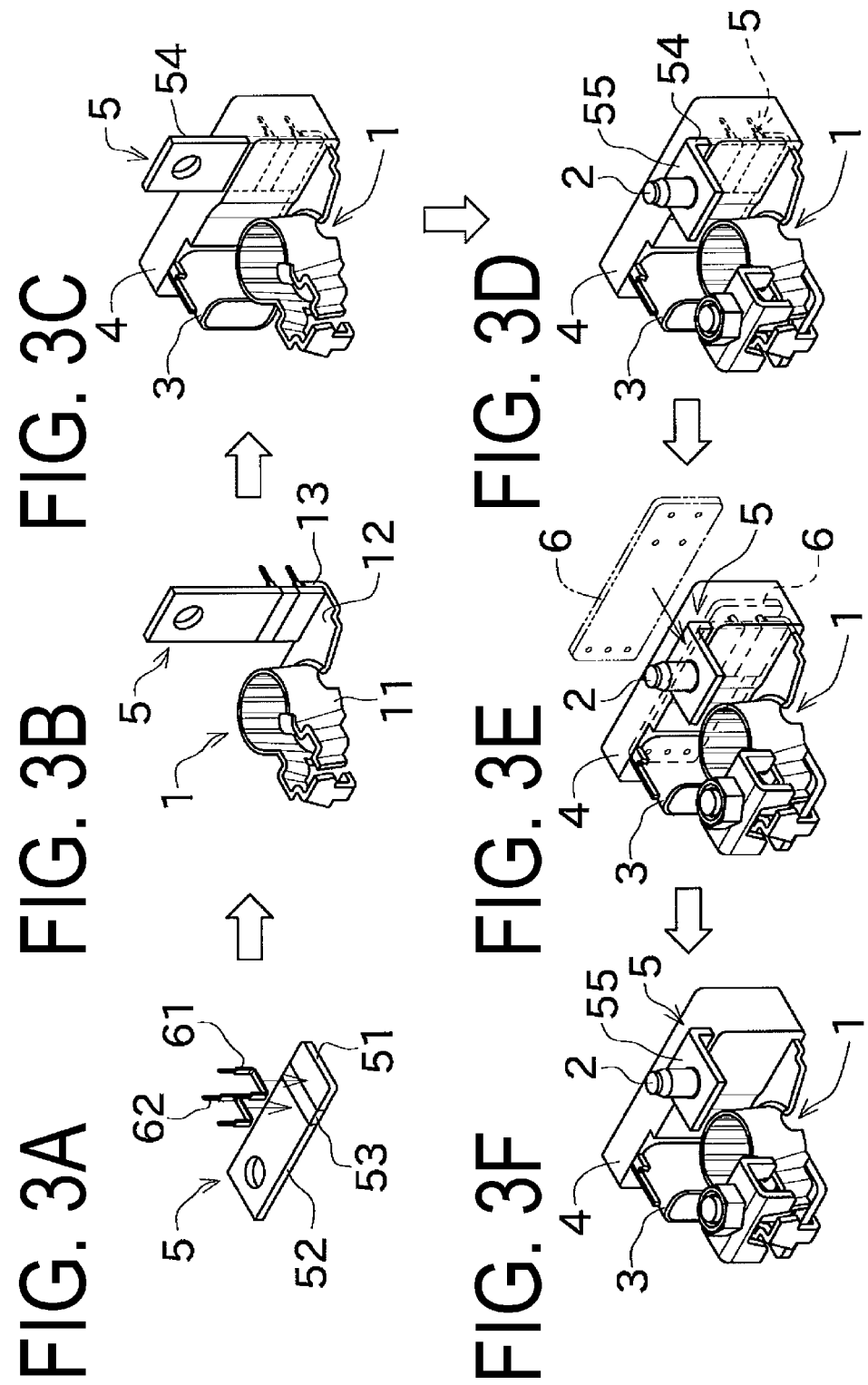
FIGS. 3A to 3F are schematic diagrams illustrating a process of manufacturing the battery state detecting device.

As illustrated in FIG. 3A, the shunt resistor 5 includes a first conductor 51, a second conductor 52, and a resistor 53 having a known resistance value (e.g. manganin). The first conductor 51, the second conductor 52, and the resistor 53 are formed as flat plates. As illustrated in FIG. 3A, the resistor 53 is arranged between the first conductor 51 and the second conductor 52, the first conductor 51 is joined to the resistor 53, and the resistor 53 is joined to the second conductor 52. By arranging and connecting the first conductor 51, the resistor 53, and the second conductor 52 in this manner, the shunt resistor 5 is formed having an overall elongated plate shape. Note that the direction in which the first conductor 51, the resistor 53, and the second conductor 52 are arranged matches the length direction of the shunt resistor 5.

As illustrated in FIG. 3A, board connection terminals 61 and 62, which are connected to the circuit board 6, are provided on the first conductor 51 and the second conductor 52, respectively, of the shunt resistor 5. As illustrated in FIGS. 2 and 3A, the board connection terminals 61 and 62 are formed by bending each of both end portions of an elongated plate-shaped metal member at right angles such that both end portions point in the same direction. The bent end portions function as connecting portions with the circuit board 6, and are connected to the circuit board 6 with solder or the like. An electronic circuit is formed in the circuit board 6 from a circuit pattern formed from a conductor such as copper foil, electronic components mounted on the circuit pattern, and the like. The unbent middle parts of the board connection terminals 61 and 62 are attached by welding to the surfaces of the first conductor 51 and the second conductor 52, respectively, of the shunt resistor 5. Accordingly, the shunt resistor 5 is mechanically connected to the circuit board 6 and electrically connected to the above-described electronic circuit via the board connection terminals 61 and 62.

The circuit board 6 is arranged on the far side of the shunt resistor 5 as seen from the post connection terminal 1. The circuit board 6 is arranged such that the thickness direction thereof is parallel to the thickness direction of the shunt resistor 5. Using the above-described electronic circuit mounted on the circuit board 6, the circuit board 6 can measure a potential difference between the first conductor 51 and the second conductor 52 via the board connection terminals 61 and 62. Information of the measured potential difference is used to obtain an amount of current flowing in the resistor 53 of the shunt resistor 5. The circuit board 6 is connected to the output terminals 31 in the connector 3. The circuit board 6 calculates the amount of current from the potential difference arising in the above-described resistor 53, detects a state of the battery 90 on the basis of the potential difference, the amount of current, and the like, and outputs the result of the detection to the ECU or the like via the output terminals 31.

A characteristic configuration of the battery state detecting device 100 according to the present embodiment will be described next. When describing the relative positional relationships among the constituent elements, the following descriptions may use the terms "front", "back", "left", "right", "up", and "down" as defined according to the arrows in FIGS. 1, 2, and the like. However, these directions are only defined for the sake of simplicity, and the orientation in which the battery state detecting device 100 is installed, the position of the depression 92, and the like can be changed as appropriate. The front-back direction and the up-down direction are perpendicular to each other, the front-back direction and the left-right direction are perpendicular to each other, and the up-down direction and the left-right direction are perpendicular to each other.

Compared to battery state detecting devices in the related art (e.g. the battery state detecting device disclosed in Patent Document 1), this battery state detecting device 100 is configured such that both the dimension in the direction in which the post connection terminal 1 and the casing 4 (the circuit board 6) are arranged and the dimension in the length direction of the casing 4 are smaller.

This will be described in detail. In the present embodiment, the battery post 91 is arranged oriented in the up-down direction. Accordingly, in the battery state detecting device 100, the post connection terminal 1 is arranged such that the axial direction of the post connecting portion 11 of the post connection terminal 1 is oriented in the up-down direction, as illustrated in FIGS. 1 and 2.

As illustrated in FIG. 1, the depression 92 formed in the battery 90 is formed to be open on the upper side, the front side, and the left side. The casing 4 of the battery state detecting device 100 is arranged to the back of the post connection terminal 1. The casing 4, which is formed in an elongated parallelepiped shape, is arranged such that the thickness direction thereof corresponds to the front-back direction, the length direction thereof corresponds to the left-right direction, and the width direction thereof corresponds to the up-down direction. Furthermore, as illustrated in FIG. 2, the circuit board 6 accommodated in the casing 4 is arranged such that the thickness direction, length direction, and width direction of the circuit board 6 match the thickness direction, length direction, and width direction of the casing 4.

By arranging the casing 4 and the circuit board 6 at an erect attitude in this manner, the width of the battery state detecting device 100 according to the present embodiment in the front-back direction can be made narrower. Accordingly, as illustrated in FIG. 1, the casing 4 can be arranged in a narrow space between the battery post 91 and an inner wall surface of the depression 92, and thus the battery state detecting device 100 can fit in the depression 92 in the DIN-standard battery 90.

Furthermore, as illustrated in FIGS. 1 and 2, in the battery state detecting device 100 according to the present embodiment, the post connection terminal 1, the harness connection terminal 2, and the connector 3 are all arranged on one side of the casing 4 in the thickness direction thereof (in FIGS. 1 and 2, the front side of the casing 4). The harness connection terminal 2 and the connector 3 are configured to protrude on one side (the front side) of the casing 4 in the thickness direction thereof, as viewed from the axial direction of the battery post 91 (the up-down direction).

It is therefore easy to arrange the post connection terminal 1, the harness connection terminal 2, and the connector 3 to fit within the length direction dimension of the casing 4. As a result, the left-right direction dimension of the battery state detecting device 100 can be made equal to the length direction dimension of the casing 4, and thus the dimension of the battery state detecting device 100 in the left-right direction (the length direction of the casing 4) can be made smaller. Thus, as illustrated in FIG. 1, the battery state detecting device 100 can be arranged even in the narrow depression 92 of the DIN-standard battery 90.

Additionally, as illustrated in FIG. 2, a bolt 21 is attached to the post connection terminal 1 of the battery state detecting device 100 according to the present embodiment. The bolt 21 is arranged such that an axis line thereof matches the up-down direction (is parallel to the axial direction of the battery post 91). A tightening nut (fastening member) 23 for strongly compressing a tightening member 22 is attached to the bolt 21. The post connecting portion 11 has a pair of gripping portions formed in a curved manner so as to conform to the periphery of the battery post 91 and tapered surfaces are formed in the tip portions of the gripping portions. With this configuration, when the tightening nut 23 is rotated, the tightening member 22 is compressed in the axial direction. The above-described tapered surfaces of the post connecting portion 11 (the gripping portions) are pushed in a constricting diameter direction by tapered portions of the tightening member 22, and the post connection terminal 1 is attached to the battery post 91 as a result. Thus, according to the present embodiment, the post connection terminal 1 is fixed to the battery post 91 by tightening the tightening nut 23 parallel to the axial direction of the battery post 91. Accordingly, compared to a configuration such as in the example of the related art illustrated in FIG. 10 (a configuration where the battery post terminal 101 is fastened at an angle using a bolt and a nut (not illustrated)), the left-right direction dimension of the part for tightening the post connection terminal 1 can be made smaller.

As described above, with the battery state detecting device 100 according to the present embodiment, the dimension in which the post connection terminal 1 and the casing 4 are arranged and the length direction dimension of the casing 4 can both be made smaller, and the left-right direction dimension of the part for tightening the post connection terminal 1 can be made smaller. The structure of the battery state detecting device 100 is therefore smaller, which increases the degree of freedom with which the device can be arranged.

Accordingly, as illustrated in FIG. 1, the battery state detecting device 100 according to the present embodiment can be attached to the battery post 91 such that the thickness direction of the casing 4 matches the front-back direction, and can also be attached to the battery post 91 such that the thickness direction of the casing 4 matches the left-right direction in FIG. 1.

Specifically, as described above, the quadrangular depression 92 formed in the battery 90 is formed to be open on the upper side, the front side, and the left side. Additionally, inner wall portions are formed in the depression 92 on the sides opposite from the open sides (the bottom side, the back side, and the right side). With the configuration illustrated in FIG. 1, the casing 4 of the battery state detecting device 100 is arranged to be adjacent to the inner wall portion on the back side of the quadrangular depression 92. However, the orientation of the battery state detecting device 100 may be changed by being rotated 90° clockwise about the axis of the battery post 91, when viewed in plan view, such that the casing 4 is adjacent to the inner wall portion on the right side of the depression 92.

It is known that the arrangement of a harness connected to the battery state detecting device 100 will differ depending on the configuration of the vehicle in which the battery 90 is installed. With respect to this point, the battery state detecting device 100 according to the present embodiment achieves a compact configuration, and thus the position where the battery state detecting device 100 can be changed flexibly, as described above. Accordingly, the harness can be connected easily even when routed in a variety of different directions.

Figure 4:
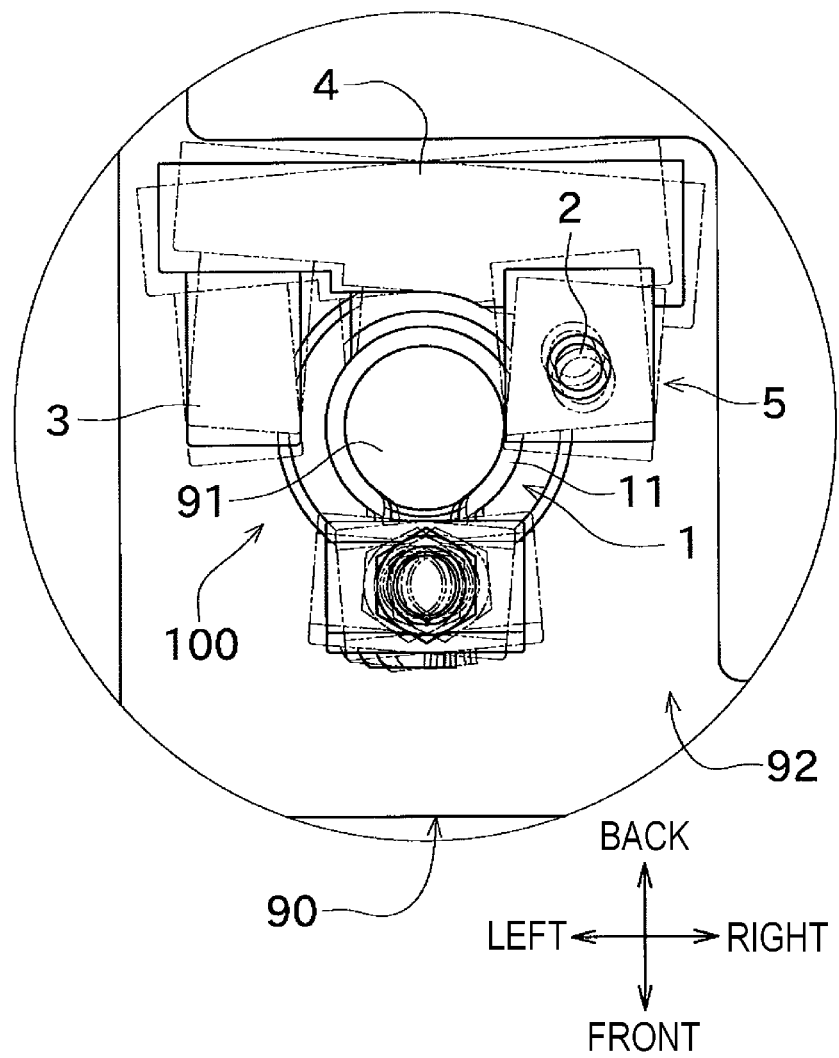
FIG. 4 is a plan view of the battery state detecting device.

Note that when viewed in the axial direction of the post connecting portion 11 (the up-down direction), the harness connection terminal 2 is arranged on one side (the right side) of the casing 4 in the length direction thereof, and the connector 3 is arranged on the other side (the left side) of the casing 4 in the length direction thereof, as illustrated in FIGS. 4 and 5. At least part of the post connecting portion 11 of the post connection terminal 1 is arranged within a space 10 between the harness connection terminal 2 and the connector 3. To rephrase, the harness connection terminal 2 is arranged on one side, and the connector 3 on the other side, interposing the axis line of the battery post 91 (the axis line of the post connecting portion 11).

This realizes a configuration that prevents positional shift in the battery state detecting device 100 (positional shift as indicated by the dashed lines in FIG. 4). That is, there are situations where, for some reason such as wires being pulled during assembly work, a force is imparted on the casing 4 through wiring (not illustrated) connected to the harness 80 connected to the harness connection terminal 2 and the connector 3. However, according to the layout described in the present embodiment, a force imparted on the harness connection terminal 2 and the connector 3 will be distributed to both sides of the casing 4 in the length direction. Accordingly, the position of the battery state detecting device 100 does not shift easily, and the position where the device is attached can be maintained favorably.

Furthermore, the battery state detecting device 100 according to the present embodiment achieves a smaller form factor through the above-described configuration, and thus a gap of a certain size can be formed between the casing 4 and the inner wall surface of the depression 92 while the battery 90 is arranged in the depression 92, as illustrated in FIG. 4. As a result, even in a case where there is error in the position or the like of the battery post 91, for example, that error can be absorbed by the above-described gap and the battery state detecting device 100 can be attached without problems.

In the battery state detecting device 100 according to the present embodiment, wiring can be routed to the harness connection terminal 2 in a variety of different directions as illustrated in FIG. 1.

To describe in detail, in the battery state detecting device 100 according to the present embodiment, the shunt resistor 5 is arranged such that the length direction thereof matches the up-down direction (such that the second conductor 52 is on the upper side), as illustrated in FIG. 3B. The length direction dimension of the shunt resistor 5 according to the present embodiment is greater than the width (height) of the casing 4. As a result, when the casing 4 is formed with the shunt resistor 5 inserted, a protruding portion 54 protruding from the upper side of the casing 4 is formed, as illustrated in FIG. 3C. Note that the protruding portion 54 is the second conductor 52 of the shunt resistor 5 partially protruding from the casing 4.

As illustrated in FIG. 2, the protruding portion 54 is bent at a right angle toward the post connecting portion 11 (to the front). As a result, an end portion of the shunt resistor 5 is bent into an L shape, and an attachment portion 55 is formed. The attachment portion 55 is oriented perpendicular to the main body portion of the shunt resistor 5. The attachment portion 55 is bent at an area close to the casing 4, and thus the mechanical strength of the base portion of the protruding portion 54 can be increased.

The attachment portion 55 is formed as a flat plate, the thickness direction of which is oriented in the up-down direction, as illustrated in FIGS. 1 and 2. The harness connection terminal 2 is fixed to the attachment portion 55 using an appropriate method, such as press-fitting, so as to protrude perpendicular thereto. As a result, the wire to the harness connection terminal 2, namely the harness 80, can be arranged freely within a plane perpendicular to the up-down direction. In FIG. 1, a plurality of variations of the embodiment pertaining to the arrangement of the harness 80 are indicated by dashed lines.

To prevent the harness 80 connected to the harness connection terminal 2 from rotating unintentionally, a rotation stopping portion 82 is provided on the terminal 81 of the harness 80. The rotation stopping portion 82 can be formed by bending a part of the tip of the terminal 81, for example, as illustrated in FIG. 1. However, the rotation stopping portion 82 may be omitted.

Thus, according to the present embodiment, the harness connection terminal 2 can be arranged above the casing 4, and thus a broad space can be secured in the periphery of the harness connection terminal 2. The degree of freedom with which the harness connection terminal 2 can be arranged can be increased as a result.

Additionally, in the present embodiment, the harness connection terminal 2 and the connector 3 are arranged so as to be shifted from each other in the axial direction of the battery post 91 (the up-down direction). Specifically, the harness connection terminal 2 is arranged to the front of the casing 4 and higher than the casing 4, as illustrated in FIGS. 1 and 2. Additionally, the harness connection terminal 2 is arranged higher than the post connecting portion 11 of the post connection terminal 1. The harness connection terminal 2 is arranged diagonally above both the casing 4 and the post connecting portion 11. Meanwhile, the connector 3 is arranged next to the post connecting portion 11 in an orientation perpendicular to the axial direction of the battery post 91, and is provided protruding to the front from the front surface of the casing 4.

In other words, a so-called two-stage distributed arrangement is achieved, where the connector 3 and the post connecting portion 11 are arranged next to each other on the side closer to the base of the battery post 91, and the harness connection terminal 2 is arranged on the side further from the base of the battery post 91. Accordingly, even in the case where for some reason a force is imparted on the casing 4 through wiring, such as wires being pulled during assembly work (not illustrated), connected to the harness 80 connected to the harness connection terminal 2 and the connector 3, that force can be distributed in the up-down direction. As a result, the position of the battery state detecting device 100 does not shift easily, and the connection in the post connecting portion 11 can be prevented from loosening or the like.

When viewed in the axial direction of the battery post 91, the harness connection terminal 2 is arranged on one side of the post connecting portion 11 (the battery post 91) and the connector 3 is arranged on the other side of the post connecting portion 11 with respect to the length direction of the casing 4, as indicated in the plan view (FIG. 4). When viewed in the axial direction of the battery post 91, the post connecting portion 11, the harness connection terminal 2, and the connector 3 are all arranged on the same side with respect to the thickness direction of the casing 4. Furthermore, when viewed in the axial direction of the battery post 91, the post connecting portion 11, the harness connection terminal 2, and the connector 3 are all arranged next to each other in substantially a straight line along the length direction of the casing 4. Accordingly, the battery state detecting device 100 as a whole can have a smaller form factor.

A fixing structure of the shunt resistor 5 will be described next.

In the battery state detecting device 100 according to the present embodiment, the linking portion 12 of the post connection terminal 1 is formed as a wall portion extending backward (toward the circuit board 6) from a lower end of the outer peripheral surface of the post connecting portion 11. A back end portion of the linking portion 12 (an end portion closer to the circuit board 6) is bent to substantially a right angle, and a fixing portion 13 for fixing the shunt resistor 5 is formed in that portion.

As illustrated in FIG. 2, the fixing portion 13 is formed as a vertical wall portion, and has a wall surface extending in the left-right direction and the up-down direction. The shunt resistor 5 is fixed to the fixing portion 13 through an appropriate method such as welding in a state where a surface on one side of the shunt resistor 5 (specifically, the first conductor 51) in the thickness direction thereof is in contact with the surface of the fixing portion 13 facing the post connecting portion 11 (a fixing surface).

As a result, the shunt resistor 5 can be supported via the fixing portion 13 without the position of the shunt resistor 5 shifting in the up-down direction. Additionally, in the present embodiment, one end portion of the shunt resistor 5 is arranged on an inner side of the part where the fixing portion 13 connects to the linking portion 12 in an L shape. Thus, in addition to welding the bottom end surface of the shunt resistor 5 to connect to the linking portion 12, a surface on one side of the shunt resistor 5 in the thickness direction thereof can be welded to connect to the fixing portion 13. The mechanical strength at which the shunt resistor 5 is fixed can be increased as a result.

Figure 6:
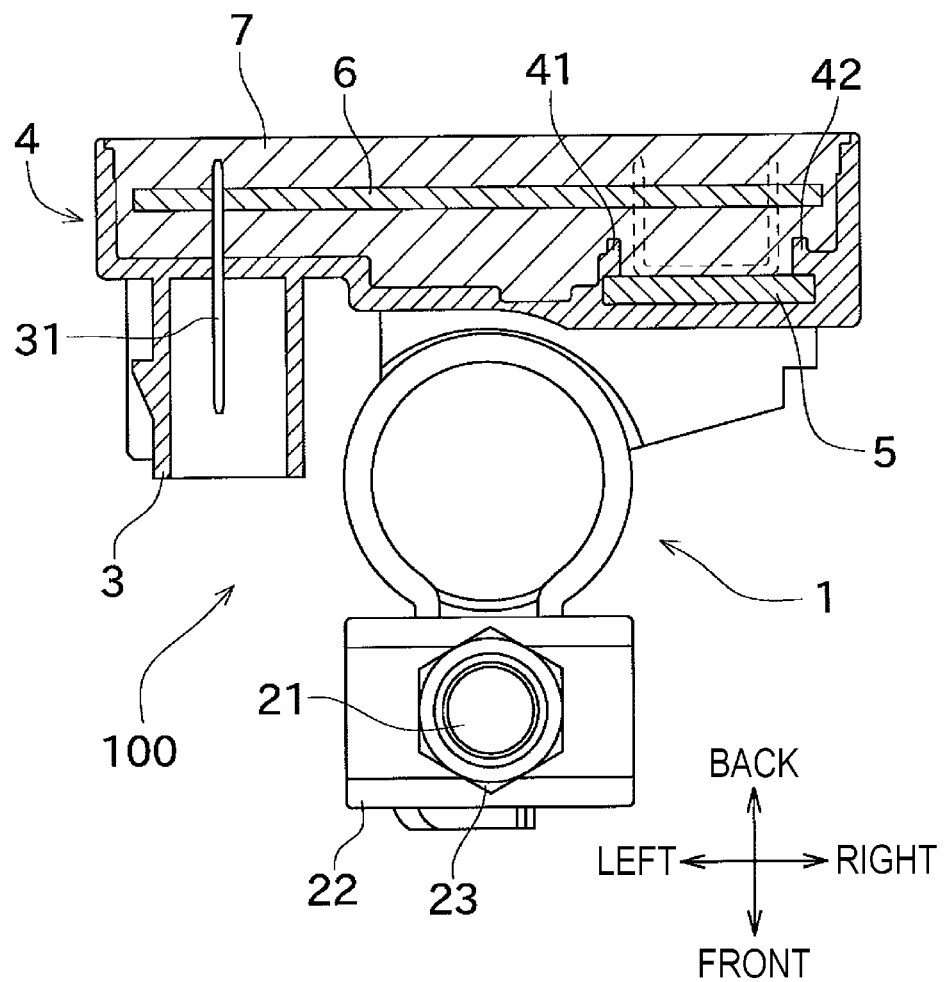
FIG. 6 is a plan view/partial cross-sectional view of an inner part of a casing part of the battery state detecting device.

As illustrated in FIG. 6, restricting portions 41 and 42 are formed in the casing 4 to restrict the position of the shunt resistor 5.

Each of the restricting portions 41 and 42 is provided on each side of the shunt resistor 5 in the width direction to restrict both sides of the shunt resistor 5 in the width direction. To describe in more detail, the casing 4 is formed through insertion molding such that a surface on one side of the shunt resistor 5 in the thickness direction thereof is covered while the other surface (a back surface, on the open side of the casing 4) is exposed, as illustrated in FIG. 6. Each of the restricting portions 41 and 42 is configured to cover each width direction end of the exposed surface of the shunt resistor 5. As a result, the shunt resistor 5 is surrounded by the casing 4 in the thickness direction and the width direction, and thus the shunt resistor 5 can be favorably fixed so as not to move.

The process of manufacturing the battery state detecting device 100 will be briefly described next with reference to FIGS. 3A to 3F.

First, as illustrated in FIG. 3A, the board connection terminals 61 and 62 are attached through welding or the like to the shunt resistor 5. Then, as illustrated in FIG. 3B, the shunt resistor 5 to which the board connection terminals 61 and 62 have been attached is oriented in the up-down direction, and is fixed to the fixing portion 13 of the post connection terminal 1. Next, the casing 4 illustrated in FIG. 3C is formed through insertion molding by inserting the post connection terminal 1 to which the shunt resistor 5 has been fixed and the output terminals 31 of the connector 3 into a die (not illustrated) and injecting a resin into the die (a casing formation step). By forming the casing 4 through insertion molding as described above, it is easy to form the casing 4 so as to conform to the complex shape of the post connection terminal 1, to which the shunt resistor 5 is attached, and the inner structure can be favorably protected.

Next, the protruding portion 54 of the shunt resistor 5 protruding upward from the casing 4 is bent at a right angle through pressing or the like, forming the attachment portion 55 for the harness connection terminal 2, as illustrated in FIG. 3D. The harness connection terminal 2 is then fixed to the attachment portion 55. Then, as illustrated in FIG. 3E, the circuit board 6 is assembled with the shunt resistor 5 accommodated within the casing 4. The position of the shunt resistor 5 is restricted by the restricting portions 41 and 42, and thus the assembly of the circuit board 6 can be carried out with ease.

After the assembly of the circuit board 6, a molding resin 7 is injected from the open side of the casing 4 so as to fill the gaps on the inner parts of the casing 4, as illustrated in FIG. 6. This seals the casing 4 through molding (a mold sealing step). Sealing the casing 4 with a resin in this manner makes it possible to prevent foreign objects such as water, oil, and dust from entering, which in turn makes it possible to protect the circuit board 6 sealed in the casing 4. The battery state detecting device 100 illustrated in FIG. 3F is completed through this process.

The molding resin 7 is fixed to the casing 4 by curing the resin. The bonding strength (holding strength) of the molding resin 7 to the casing 4 is proportional to the contact surface area between the casing 4 and the molding resin 7. Thus, the bonding strength of the molding resin 7 to the casing 4 can be increased by forming recesses and projections in the inner side surfaces of the casing 4, for example (the inner surface of parts where the thickness direction matches the up-down direction or the left-right direction, a surface facing an edge of the circuit board 6). The recesses and projections may have any shape, and may be formed as rounded or polygonal (quadrangular or triangular, for example) projections or recesses. The recesses and projections may be formed on the entire inner side surface of the casing 4, or on only part thereof. In a case where the recesses and projections are formed on only part of the inner side surface of the casing 4, it is preferable that the recesses and projections be formed closer to the open side (the back side) than the location where the circuit board 6 is arranged, for example.

As illustrated in FIG. 6, in the present embodiment, the position of the end surface of the casing 4 on the open side thereof (the surface facing the back) and the position of the surface of the molding resin 7 exposed to the exterior (the surface facing the back) match in the front-back direction. Instead of this configuration, the end surface of the casing 4 on the open side thereof may be configured to be located further toward the back than the surface of the molding resin 7 exposed to the exterior. This makes it possible to protect the molding resin 7 such that a tool, the battery 90, or the like does not come into contact with the molding resin 7. The casing 4 is harder than the molding resin 7, and thus the molding resin 7 can be protected well. Note that the entire end surface of the casing 4 on the open side thereof may be located further back than the molding resin 7, or only part of the end surface of the casing 4 in the open side thereof may be located further back than the molding resin 7.

As illustrated in FIG. 6, which is a plan view/partial cross-sectional view showing a cross-section obtained by sectioning the casing 4 of the battery state detecting device 100 along the dotted line in FIG. 5, the surface of the molding resin 7, injected into the casing 4, that is exposed to the exterior is configured to be vertical when the battery state detecting device 100 is attached to the battery 90. Thus, even in a case where a foreign object such as water, oil, or dust falling from above adheres to the molding resin 7, that foreign object will fall off under its own weight. Accordingly, moisture or the like can be prevented from remaining on parts of the molding resin 7 for long periods of time, and thus the circuit board 6 accommodated within the casing 4 can be protected even better.

As described above, the battery state detecting device 100 according to the present embodiment connects the battery 90 and the harness 80, and detects a state of the battery 90. The battery state detecting device 100 includes the shunt resistor 5, the post connection terminal 1, the harness connection terminal 2, the circuit board 6, and the connector 3. The post connection terminal 1 is electrically connected to the battery post 91 of the battery 90. The harness connection terminal 2 is electrically connected to the harness 80. The circuit board 6 detects current flowing in the shunt resistor 5. The connector 3 outputs a result of the detection made by the circuit board 6. The post connection terminal 1 is arranged next to the circuit board 6 in the thickness direction of the circuit board 6 (the front-back direction). At least part of the post connecting portion 11 of the post connection terminal 1 is arranged within a space 10 between the harness connection terminal 2 and the connector 3 on one side of the circuit board 6 in the thickness direction thereof (the front side).

Figure 10:
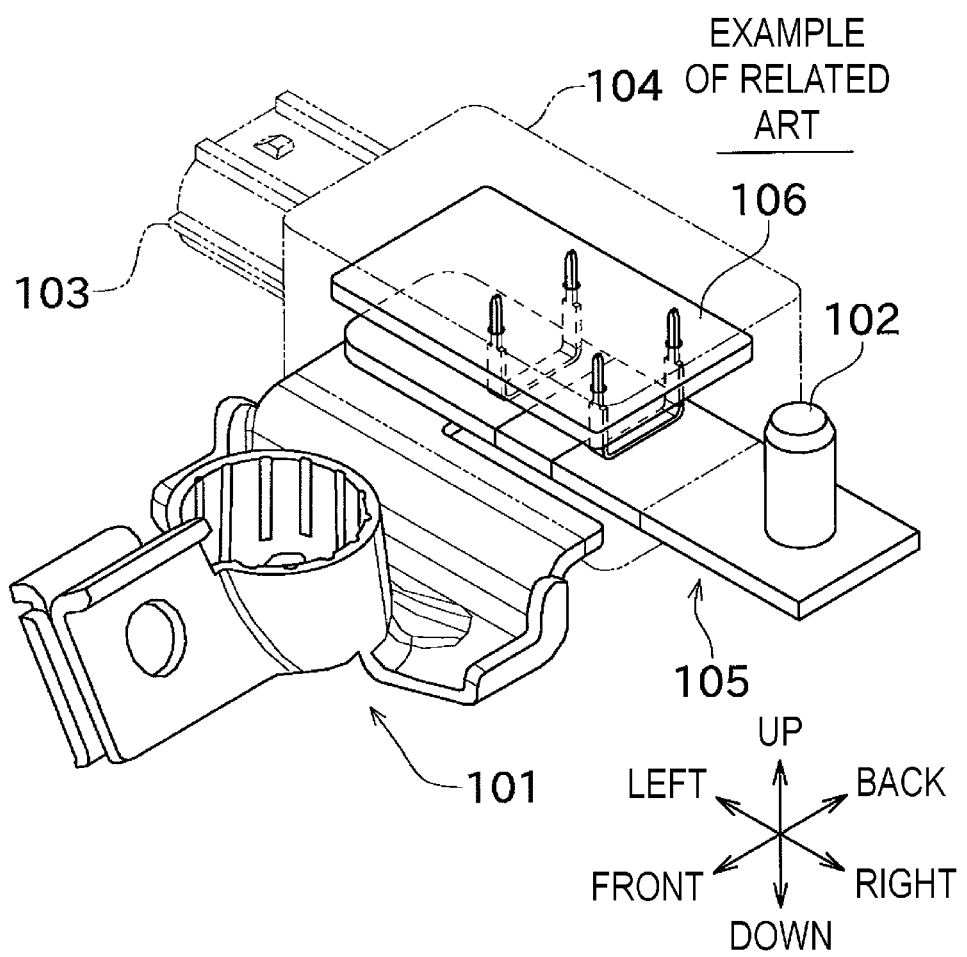
FIG. 10 is a perspective view illustrating an example of a configuration in the related art.

Thus, compared to a configuration such as the example of the related art illustrated in FIG. 10, where the battery post terminal 101 is arranged on one side of the circuit board 106 (the case 104) in the width direction thereof, the dimension of the battery state detecting device 100 in the direction in which the casing 4 and the post connection terminal 1 are arranged (the dimension in the front-back direction) can be reduced, as illustrated in FIG. 1. Additionally, compared to a configuration such as the example of the related art illustrated in FIG. 10, where the harness connecting portion 102 and the connector 103 are each arranged to project from respective length direction end sides of the circuit board 106 (the case 104) in the length direction thereof, the dimension of the battery state detecting device 100 in the length direction of the casing 4 (the circuit board 6) (the dimension in the left-right direction) can be reduced, as illustrated in FIG. 1. As a result, the space taken up by the battery state detecting device 100 in the aforementioned two directions can be reduced, and a reduction in the overall form factor of the device can be achieved. Furthermore, when viewed in the up-down direction, the harness connection terminal 2 and the connector 3 are arranged on each side of the post connection terminal 1, and thus even in the case where a force is for some reason imparted on wiring connected to these elements, that force can be prevented from concentrating on one part of the battery state detecting device 100. Accordingly, the position of the battery state detecting device 100 does not shift easily, and the position where the battery state detecting device 100 is attached can be maintained favorably.

Additionally, in the battery state detecting device 100 according to the present embodiment, the harness connection terminal 2 is arranged in a position shifted upward, relative to both the post connection terminal 1 and the connector 3, in the axial direction of the battery post 91.

Accordingly, a broad space can be secured in the periphery of the harness connection terminal 2, and thus the degree of freedom with which wiring can be routed to the harness connection terminal 2 can be increased. Furthermore, the harness connection terminal 2 and the connector 3 are arranged so as to be shifted with respect to the up-down direction, and thus even in the case where a force is for some reason imparted on wiring connected to these elements, that force can be distributed in the up-down direction without concentrating on one part of the battery state detecting device 100 in the up-down direction. Accordingly, the position of the battery state detecting device 100 does not shift easily, and the position where the battery state detecting device 100 is attached can be maintained favorably.

Additionally, in the battery state detecting device 100 according to the present embodiment, the shunt resistor 5 is formed having an elongated plate shape, and has a part arranged such that the length direction thereof matches the up-down direction. The shunt resistor 5 includes the first conductor 51, the resistor 53, and the second conductor 52, arranged in that order from the bottom. The harness connection terminal 2 is provided on the second conductor 52.

Accordingly, the space for arranging the shunt resistor 5 can be reduced, which in turn makes it possible to reduce the space taken up by the battery state detecting device 100. With the above-described simple configuration, it is easy to arrange the harness connection terminal 2 away from the post connection terminal 1 and the connector 3 in the up-down direction, and thus the degree of freedom with which wiring can be routed to the harness connection terminal 2 can be increased with ease.

Additionally, in the battery state detecting device 100 according to the present embodiment, the post connection terminal 1 includes the plate-shaped linking portion 12 extending toward the circuit board 6. The fixing portion 13 is formed in the end portion of the linking portion 12 closer to the circuit board 6 by bending that end portion. The shunt resistor 5 is fixed to the fixing portion 13.

Accordingly, the shunt resistor 5 is fixed to the fixing portion 13, which has a bent shape, and thus the degree of freedom of the orientation of the shunt resistor 5 can be increased.

Additionally, in the battery state detecting device 100 according to the present embodiment, the fixing portion 13 has the fixing surface facing the post connecting portion 11. The shunt resistor 5 is formed having an elongated shape. An end surface on one side of the shunt resistor 5 in the length direction thereof (a bottom end surface) is connected to the linking portion 12. A surface on one side of the shunt resistor 5 in the thickness direction thereof (the surface facing the back) is connected to the fixing surface of the fixing portion 13.

Accordingly, the shunt resistor 5 is fixed via two surfaces of the shunt resistor 5, which makes it possible to increase the mechanical strength of the fixed part with ease and favorably maintain the position of the shunt resistor 5.

Additionally, the battery state detecting device 100 according to the present embodiment includes the casing 4 that accommodates the circuit board 6. At least part of the shunt resistor 5 (the first conductor 51, the resistor 53, and the like) is accommodated within the casing 4. The restricting portions 41 and 42 that restrict the position where the shunt resistor 5 is accommodated are formed in the casing 4.

Accordingly, the position of the shunt resistor 5 can be favorably restricted, and thus the battery state detecting device 100 can be assembled with ease.

Additionally, in the battery state detecting device 100 according to the present embodiment, the shunt resistor 5 includes the protruding portion 54 that protrudes from one side (the upper side) of the casing 4. The protruding portion 54 includes the attachment portion 55 formed by bending the protruding portion 54 at a part close to the casing 4. The harness connection terminal 2 is provided on the attachment portion 55.

Accordingly, the mechanical strength of the base portion of the protruding portion 54 can be increased. Additionally, the overall configuration of the battery state detecting device 100 in the length direction of the shunt resistor 5 can be made more compact.

Additionally, the battery state detecting device 100 according to the present embodiment is manufactured using a method including forming a casing and sealing a mold. The forming the casing includes forming the casing 4 that partially accommodates the shunt resistor 5 through insertion molding so as to be integrated with the shunt resistor 5. The sealing the mold includes sealing the internal space of the casing 4 with the molding resin 7 in a state where the circuit board 6 is accommodated within the casing 4.

Accordingly, the casing 4 can easily be formed so as to conform to the position, shape, and the like of the shunt resistor 5. Furthermore, the inner part of the casing 4 is sealed with the molding resin 7 so as to cover the entire circuit board 6, which makes it possible to prevent water, foreign objects, and the like from entering and favorably protect the circuit board 6.

Although a preferred embodiment of the present disclosure has been described thus far, the above-described configuration can be modified as follows, for example.

Figure 7:
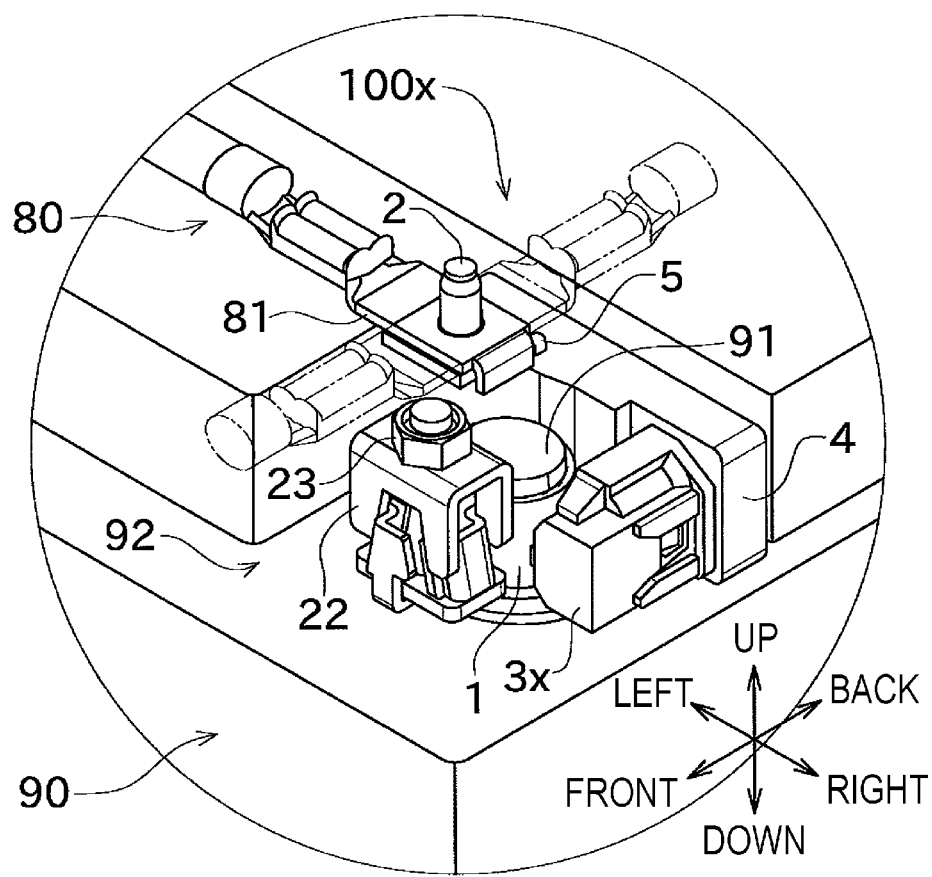
FIG. 7 is a perspective view of a battery state detecting device according to a first variation of the embodiment.

The configuration is not limited to one in which the harness connection terminal 2, the post connection terminal 1, and the connector 3 are arranged in order from the right side, and the positions of the harness connection terminal 2 and the connector 3 may be reversed as necessary. In other words, in a battery state detecting device 100x, the connector 3, the post connection terminal 1, and the harness connection terminal 2 may be arranged in order from the right side, as illustrated in FIG. 7 (a first variation of the embodiment). Like the battery state detecting device 100 according to the above-described embodiment, the battery state detecting device 100x having this configuration can achieve a favorable reduction in the form factor. Additionally, a large connector 3x such as that illustrated in FIG. 7 may be used instead of the connector 3 illustrated in FIG. 1.

The battery state detecting device 100 configured as illustrated in FIG. 1 may be attached to the battery post 91 of either a positive electrode or a negative electrode of the battery 90. The battery state detecting device 100x configured as illustrated in FIG. 7, too, may be attached to the battery post 91 of either the positive electrode or the negative electrode of the battery 90. The above-described battery state detecting devices 100 and 100x can achieve a favorable reduction in the form factor, and thus the polarity of the electrode of the DIN-standard battery 90 to which the device is attached is not limited.

Like the battery state detecting device 100 illustrated in FIG. 1, the battery state detecting device 100x according to the first variation of the embodiment illustrated in FIG. 7 can be arranged in different orientations. In other words, as illustrated in FIG. 7, the device may be arranged such that the casing 4 is adjacent to a back-side inner wall portion forming the quadrangular depression 92, or may be arranged at an orientation 90° relative to the orientation illustrated in FIG. 7 (i.e. such that the casing 4 is adjacent to a left-side inner wall portion of the depression 92). Accordingly, the battery state detecting device 100 (100x) according to the present disclosure can be attached to the battery post 91 of either the positive electrode or the negative electrode of the battery 90, at a plurality of orientations, and thus the degree of freedom of the arrangement thereof can be increased.

In the above-described embodiment, the surface of the casing 4 facing upward is flat, an expanded portion 4a may be formed in the casing 4 as in a battery state detecting device 100y according to a second variation of the embodiment, illustrated in FIG. 8. The expanded portion 4a is formed above the connector 3 in the left-right direction (above the connector 3 when viewing the connector 3 in the insertion/removal direction thereof). Specifically, the arrangement is such that the position of the expanded portion 4a in the left-right direction and the position of the connector 3 in the left-right direction at least partially overlap. Forming the expanded portion 4a makes it possible to secure a gripping part for a worker to hold the casing 4 when connecting a terminal to the connector 3, and thus the workability can be improved.

In the above-described embodiment, the connector 3 is arranged such that the length direction of the connector 3 (i.e. the direction in which the output terminals 31 are arranged) matches the up-down direction, as illustrated in FIG. 5. The orientation of the length direction of the connector 3 is not limited to that described in the embodiment above, and the length direction of the connector 3 may match a horizontal direction (specifically, the left-right direction), as in a battery state detecting device 100z according to a third variation of the embodiment, illustrated in FIG. 9. In this case, a notch 4b can also be formed in the casing 4, underneath the connector 3. Forming the notch 4b makes it possible to form a space for a worker to insert his/her hand and hold the casing 4 when connecting a terminal to the connector 3, and thus the workability can be improved. Note that a configuration in which the notch 4b is formed to improve the workability can also be applied in the above-described embodiment.

In the above-described embodiment, the harness 80 is attached to the harness connection terminal 2, which is configured as a bolt. However, the configuration is not limited thereto, and another configuration can be employed as long as the harness connection terminal 2 and the harness 80 can be electrically connected. Furthermore, rather than providing the harness connection terminal 2, the harness 80 may be connected directly to the second conductor 52 of the shunt resistor 5 through a method such as welding.

Instead of the restricting portions 41 and 42 illustrated in FIG. 6, the casing 4 may be formed through insertion molding to surround the entire periphery of the shunt resistor 5 illustrated in FIG. 6, and the resulting part may be used as a restricting portion.

Rather than filling with the molding resin 7, the open part of the casing 4 may be closed off using a suitable cap member.

The above-described battery state detecting device 100 may be attached to a battery of a standard aside from the DIN standard. Additionally, the orientation of the battery post 91 is not limited to the up-down direction, and the battery post 91 may be arranged sideways (the left-right direction or the front-back direction illustrated in FIG. 1 and the like).

The method of manufacturing the battery state detecting device 100 described above is merely an example, and the order of some steps may be changed, two steps may be carried out simultaneously, other steps may be added, and the like.

REFERENCE SIGNS LIST

1 Post connection terminal (first connection terminal)
2 Harness connection terminal (second connection terminal)

3 Connector
4 Casing
5 Shunt resistor
6 Circuit board
7 Molding resin
10 Space
11 Post connecting portion
12 Linking portion
13 Fixing portion
41, 42 Restricting portion
51 First conductor
52 Second conductor
53 Resistor
54 Protruding portion
55 Attachment portion
80 Harness (wiring)
90 Battery
91 Battery post
100, 100x, 100y, 100z Battery state detecting device

The invention claimed is:

1. A battery state detecting device that connects a battery and a harness and detects a state of the battery, the device comprising:
 a shunt resistor;
 a first connection terminal electrically connected to a battery post of the battery;
 a second connection terminal electrically connected to the harness;
 a circuit board configured to detect current flowing in the shunt resistor; and
 a connector configured to output a result of a detection made by the circuit board,
 wherein the first connection terminal is arranged next to the circuit board in a thickness direction of the circuit board;
 at least part of a post connecting portion, the post connecting portion being a part of the first connection terminal connected to the battery post, is arranged in a space between the second connection terminal and the connector on one side of the circuit board in the thickness direction of the circuit board;
 the first connection terminal includes a linking portion, having a plate shape, that extends toward the circuit board;
 a fixing portion is formed in an end portion of the linking portion closer to the circuit board by bending the end portion;
 the shunt resistor is fixed to the fixing portion;
 the fixing portion has a fixing surface facing toward the post connecting portion;
 the shunt resistor is formed in an elongated plate shape;
 an end surface on one side of the shunt resistor in a length direction of the shunt resistor is connected to the linking portion; and
 a surface on one side of the shunt resistor in a different thickness direction of the shunt resistor is connected to the fixing surface of the fixing portion.

2. The battery state detecting device according to claim 1, wherein the second connection terminal is arranged in a position shifted relative to the first connection terminal and the connector in an axial direction of the battery post.

3. The battery state detecting device according to claim 1, wherein the shunt resistor has a part in which the length direction of the shunt resistor is arranged parallel to an axial direction of the battery post;
 the shunt resistor includes a first conductor, a resistor, and a second conductor arranged in that order from one side in the axial direction of the battery post; and
 the second connection terminal is provided on the second conductor.

4. The battery state detecting device according to claim 1, further comprising:
 a casing that accommodates the circuit board,
 wherein at least part of the shunt resistor is accommodated within the casing; and
 a restricting portion that restricts a position where the shunt resistor is accommodated is formed in the casing.

5. The battery state detecting device according to claim 4, wherein the shunt resistor includes a protruding portion, the protruding portion formed in the elongated plate shape and protruding from one side of the casing in an axial direction of the battery post,
 the protruding portion includes an attachment portion formed by bending the protruding portion from a part close to the casing; and
 the second connection terminal is provided on the attachment portion.

6. A method of manufacturing the battery state detecting device according to claim 1, the method comprising:
 forming a casing that accommodates at least part of the shunt resistor through insertion molding such that the casing and the shunt resistor are integrated; and
 sealing an internal space of the casing with a molding resin in a state where the circuit board is accommodated within the casing.

* * * * *